United States Patent [19]

Nakashima et al.

[11] 4,399,452

[45] Aug. 16, 1983

[54] EXPLOSION-PROOF SEMICONDUCTOR DEVICE

[75] Inventors: Kazuyuki Nakashima, Tokyo; Youichi Araki, Kawasaki; Yukio Igarashi, Yokohama; Shinjiro Kojima, Chigasaki, all of Japan

[73] Assignee: Tokyo Shibaura Denki Kabushiki Kaisha, Kawasaki, Japan

[21] Appl. No.: 181,652

[22] Filed: Aug. 26, 1980

[30] Foreign Application Priority Data

Aug. 31, 1979 [JP] Japan ................................. 54-110354

[51] Int. Cl.³ ...................... H01L 23/10; H01L 23/24
[52] U.S. Cl. ........................................ 357/74; 357/72; 357/79; 357/81
[58] Field of Search ......................... 357/74, 79, 81, 72

[56] References Cited

U.S. PATENT DOCUMENTS

| | | | |
|---|---|---|---|
| 3,581,160 | 5/1971 | Piccone et al. | 357/79 |
| 4,099,201 | 7/1978 | Mueller | 357/72 |
| 4,150,394 | 4/1979 | Sugawa et al. | 357/72 |
| 4,162,514 | 7/1979 | DeBruyne et al. | 357/79 |
| 4,274,106 | 6/1981 | Ohdate | 357/79 |

FOREIGN PATENT DOCUMENTS

| | | |
|---|---|---|
| 17978 | 4/1980 | European Pat. Off. |
| 1128586 | 9/1968 | United Kingdom. |
| 1217964 | 1/1971 | United Kingdom. |
| 1293915 | 10/1972 | United Kingdom. |
| 1335415 | 10/1973 | United Kingdom. |
| 2024514 | 1/1980 | United Kingdom. |

Primary Examiner—William D. Larkins
Attorney, Agent, or Firm—Finnegan, Henderson, Farabow, Garrett & Dunner

[57] ABSTRACT

With a semiconductor device embodying this invention, a semiconductor element is clamped between a pair of electrodes in a housing. A hollow cylindrical explosion-proof member is so set in the housing as to enclose the semiconductor element. The hollow cylindrical explosion-proof element is prepared from soft elastic material capable of absorbing the force of the explosion of the semiconductor element.

12 Claims, 14 Drawing Figures

F I G. 1
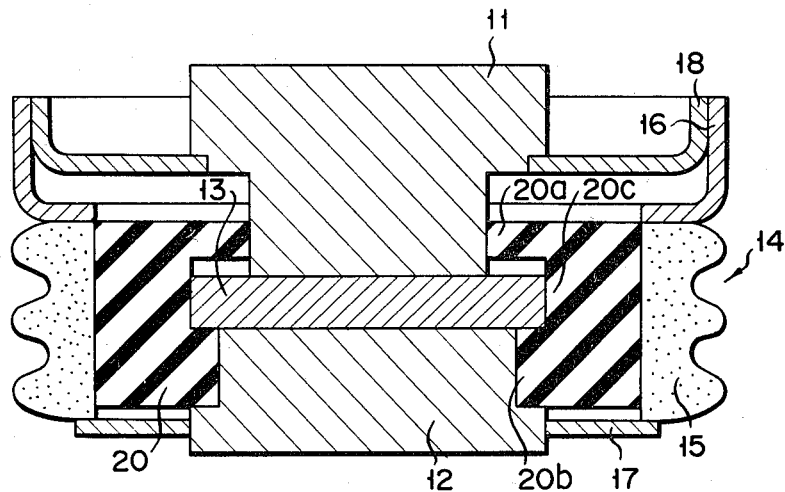
F I G. 2
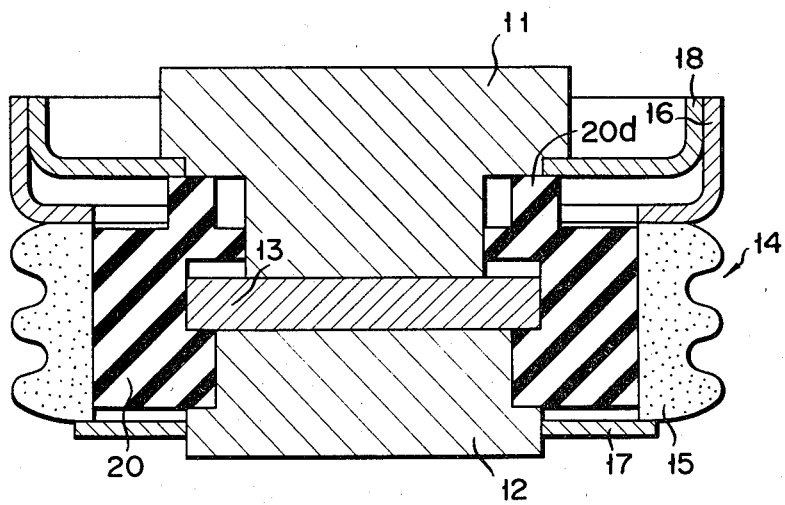

EXPLOSION-PROOF SEMICONDUCTOR DEVICE

This invention relates to a semiconductor device and more particularly to a power semiconductor device.

With the conventional power rectifier, a semiconductor element is soldered to the mutually facing end planes of a pair of electrodes vertically arranged at a proper space. The semiconductor element is sealed in a housing. This housing is formed of a ceramic cylindrical member and a pair of annular members prepared from Kovar (trade name). The paired annular members are tightly fitted to both open end portions of the ceramic cylindrical member and also to the peripheral surface of the paired vertically arranged electrodes. The inner surface of each annular member is fitted with a shielding element. This shielding element is so constructed as to prevent the annular member from being destroyed by the molten chips of a semiconductor element which would exposively scatter about at the generation of excess current and strike against the annular member.

Where, with the conventional semiconductor device, an over current of, for example, scores of kiloamperes (kA) flows through a semiconductor element, then part or the whole of the semiconductor element melts by the tremendous heat resulting from the over current. Where the molten chips of the semiconductor element explosively scatter, then the annular member is protected by the shielding element. However, the ceramic cylindrical member is directly heated by the hot molten metal chips of the semiconductor element which scatter with high pressure, and is most likely to be broken. Since this breakage explosively occurs, members disposed near the prior art power semiconductor device are seriously damaged by the explosion. Since it is quite impossible to anticipate such type of explosion, an operator who happens to lie near the conventional semiconductor device will probably be injured by the explosion.

It is accordingly the object of this invention to provide a semiconductor device which can absorb the shocks of an explosion caused by the generation of an over current, thereby preventing a housing from being damaged.

To attain the above-mentioned object, this invention provides a power semiconductor device, wherein a semiconductor element clamped between a pair of electrodes is received in an airtight housing; and a hollow cylindrical explosion-proof member prepared from an insulating material capable of sufficiently withstanding a tremendous heat produced by the above-mentioned explosion is so set in the housing as to enclose the semiconductor element.

This invention can be more fully understood from the following detailed description when taken in conjunction with the accompanying drawings, in which:

FIG. 1 is a cross-sectional view of a power semiconductor device according to an embodiment of this invention, wherein an explosion-proof member is so set in a housing as to enclose a semiconductor element;

FIG. 2 is a cross-sectional view of a power semiconductor device according to another embodiment of the invention, wherein the upper peripheral end of the explosion-proof member is provided with an annular projection tightly attached to the side surface of the upper electrode;

Figure 5:
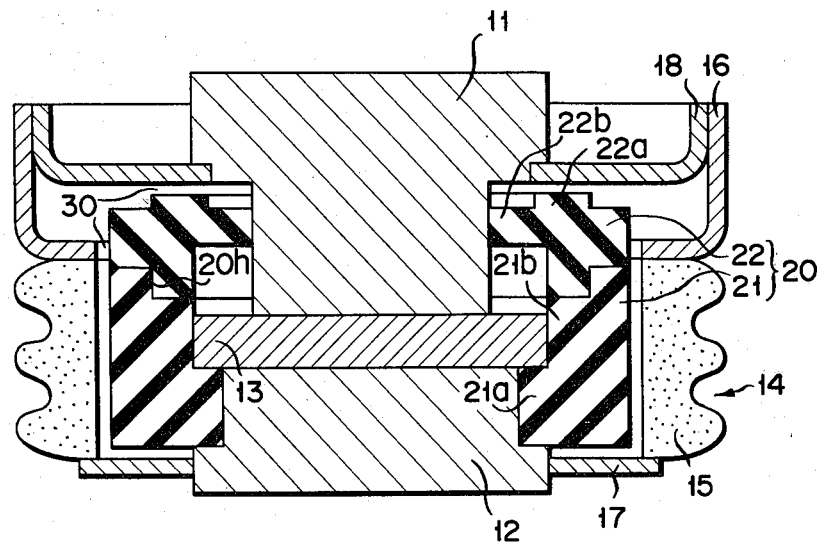
FIG. 5 is a cross-sectional view of a power semiconductor device according to a still further embodiment of the invention, wherein the explosion-proof member is formed of two components slidable in the axial direction of the semiconductor device.
Figure 7:
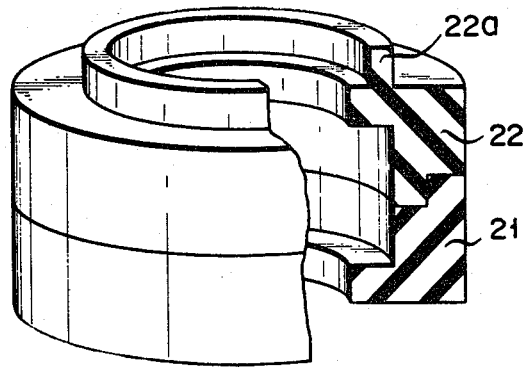
FIG. 7 is an oblique view, partly in section, of the explosion-proof member used with the embodiment of FIG. 5.
Figure 9:
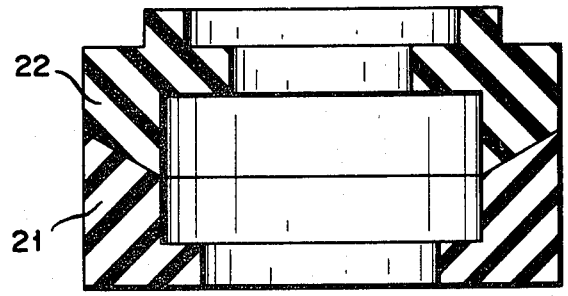

FIG. 9 is a cross-sectional view of the explosion-proof member used with the embodiment of FIG. 5, showing a still different form of junction between the two slidable components of the explosion-proof member from that of FIG. 7; and FIGS. 10A to 10E are cross-sectional views of the semiconductor device according to the embodiment of FIG. 5, showing the conditions of the device during the respective steps of its manufacture.

With a semiconductor device according to the embodiment of FIG. 1, a semiconductor element (for example, a silicone element) 13 is clamped between a pair of electrodes 11, 12. A housing 14 encloses the semiconductor element 13. The housing 14 and the electrodes 11, 12 define an airtight chamber. The housing 14 comprises a hollow cylindrical member 15 annular members 16, 17 respectively tightly attached to both open end portions of the cylindrical member 15 and inner annular member 18 tightly fixed to the inner surface of the annular member 16. The cylindrical member 15 is formed of an insulating material, for example, ceramic. The interior contour of this cylindrical member 15 indicates a regular cylindrical form. The annular members 16, 17, 18 are made of Kovar (trade name). The annular member 17 is tightly attached to the lower electrode 12. The annular member 16 is welded to the inner annular member 18, which is tightly fixed to the upper electrode 11.

A hollow cylindrical explosion-proof member 20 is so set in the housing 14 as to enclose the semiconductor element 13. The explosion-proof member 20 is made of a heat-resistant insulating material, for example, silicone rubber in the hollow cylindrical form. The upper end portion 20a of the explosion-proof member 20 extends for close contact with the side surface of the shorter diameter section of the upper electrode 11. The lower part 20b of the explosion-proof member 20 extends for close contact with the lower electrode 12. The intermediate part 20c of the explosion-proof member 20 contacts the outer peripheral surface of the semiconductor element 13 to secure it in a prescribed position.

Where, with a semiconductor device embodying this invention which is constructed as described above, an over current flows through a semiconductor element, then part or the whole of the semiconductor element melts, and the molten chips of the semiconductor element explosively scatter. At this time, however, the annular members 16, 17, 18 formed of a thin metal sheet and the cylindrical member 15 prepared from ceramic are protected by the explosion-proof member 20, and saved from the direct impingement of the hot molten chips of the exploded semiconductor element 13 (formed of, for example, silicone) which scatter with high pressure. Therefore, the annular members 16, 17, 18 and cylindrical member 15 are not destroyed.

The greater part of an arc produced by an over current generally appears at that part of the semiconductor element 13 where current is most concentrated. With a semiconductor device embodying this invention which is provided with the explosion-proof member 20, the semiconductor element 13 is clamped between the paired electrodes 11, 12 with pressure, and these electrodes 11, 12 are tightly fitten to the inner surface of the explosion-proof member 20. Therefore, an arc is prevented from being produced at the center of the semiconductor element 13, thereby elevating the critical point at which the destruction of the semiconductor element 13 is caused by an over current.

The other advantages of this invention are that the semiconductor element is fixed in place by being clamped with pressure between the paired electrodes, instead of being soldered, facilitating the positioning of the semiconductor element during the assembly of a semiconductor device, thereby avoiding the displacement of the semiconductor element caused by shocks or temperature changes after assembly; therefore, it is possible to prevent the destruction of the semiconductor element and non-uniform heat release due to the deviation of a load on the semiconductor element resulting from its displacement; and a semiconductor device can be manufactured with significant improvement in efficiency, yield and quality.

With the embodiment of FIG. 2, the explosion-proof member 20 is provided with an annular projection 20d, whose upper end is tightly attached to at least part of the underside of the larger diameter section of the upper electrode 11. The annular projection 20d tightly closes a space defined between the outer annular member 16 and inner annular member 18 which are both formed of a material having a relatively low mechanical strength. Therefore, the annular projection 20d protects the outer and inner annular members 16, 18 from the explosively scattering molten chips of the semiconductor element 13 which might otherwise give rise to their destruction.

Figure 3:
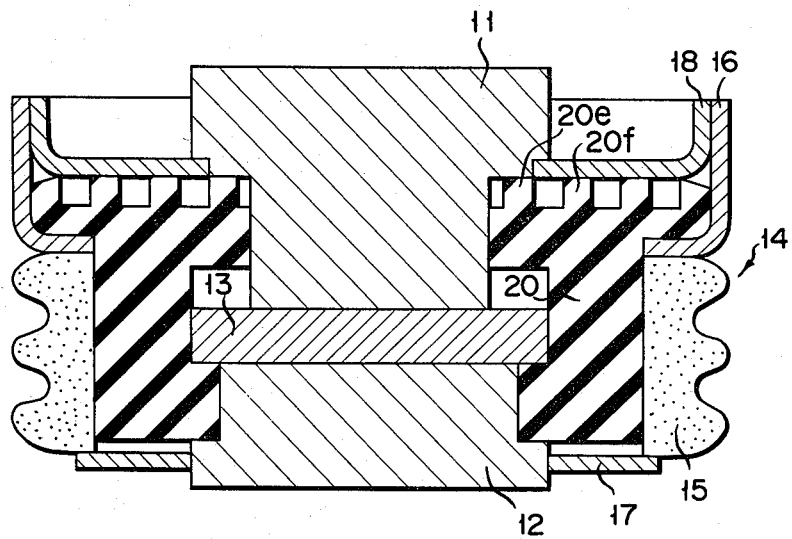
FIG. 3 is a cross-sectional view of a power semiconductor device according to still another embodiment of the invention, wherein the upper peripheral end of the explosion-proof member is provided with a plurality of annular projections, at least the innermost one of which is tightly attached to the side surface of the upper electrode.

With the embodiment of FIG. 3, the explosion-proof member 20 is provided with a plurality of annular projections 20e, 20f . . . . The innermost projection 20e is tightly attached to the underside of the larger diameter section of the upper electrode 11. The other projections 20f . . . are tightly fitted to the inner annular member 18. The annular projections 20e, 20f . . . need not have a square cross section as indicated in FIG. 3. If they are fabricated in the form of a series of triangular cross sections, that is, in the saw-toothed arrangement, then they can be more tightly attached to the upper electrode 11 and inner annular member 18. An explosion-proof member constructed as described above better serves the purpose.

Figure 4:
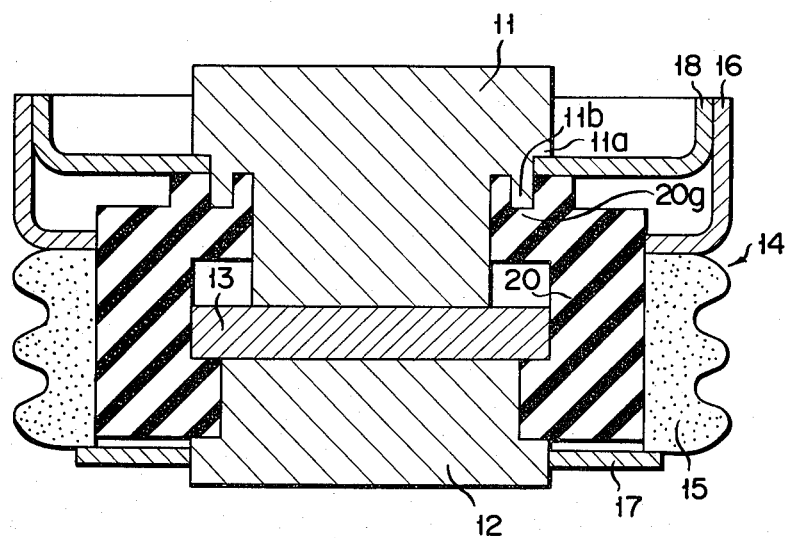
FIG. 4 is a cross-sectional view of a power semiconductor device according to a further embodiment of the invention, wherein the underside of the larger diameter section of the upper electrode is provided with an annular projection, and the explosion-proof member has an annular groove engaged with the annular projection.

With the embodiment of FIG. 4, the underside of the flanged portion 11a of the upper electrode 11 is provided with an annular projection 11b. An annular groove 20g is formed in the upper peripheral end of the explosion-proof member 20 for engagement with the annular projection 11b of the flanged portion 11a. This arrangement enables the upper electrode 11 and explosion-proof member 20 to contact each other more tightly, thereby protecting a semiconductor device from destruction resulting from the forceful explosive scattering of the molten chips of the semiconductor element 13. Conversely, it is possible to form a projection on the upper peripheral end of the explosion-proof member and the corresponding groove in the underside of the larger diameter section of the upper electrode 11. This arrangement ensures the same effect as described above. Further, it is possible to provide a plurality of projections and grooves in order to improve engagement between the upper electrode 11 and explosion-proof member 20.

With the embodiment of FIG. 5, the explosion-proof member 20 is formed of two vertically arranged separate components 21, 22. These separate explosion-proof components 21, 22 contact each other at a stepped junction 20h. This stepped junction 20h is positioned above the semiconductor element 13 at a point facing the inner annular member 18. The two separate explosion-proof components 21, 22 can slide axially of a semiconductor device in a mutually engaged state.

Under the normal condition of a semiconductor device, a gap 30 is provided between the inner surface of the housing 14 and the outer peripheral surface of the composite explosion-proof member 20. This gap 30 acts as an idle space for fully allowing for the expansion in the radial and axial directions of the composite explosion-proof member 20 resulting from the tremendous heat and pressure applied by the explosion of the semiconductor element 13 which occurs when an over current flows therethrough. Where the semiconductor element 13 is exploded, then the composite explosion-proof member 20 and housing 14 closely contact each other as illustrated by thick lines 40 in FIG. 6, causing the gap 30 to disappear. The two separate explosion-proof components 21, 22 which are made of soft elastic material such as silicone rubber are ready to expand, particularly in the radial direction. Since the explosion-proof components 21, 22 slide vertically in an engaged state, airtightness in the composite explosion-proof member 20 is not lost.

The oblique view of FIG. 7 is given as an aid to better understand the construction of the composite explosion-proof member 20. With a semiconductor device embodying this invention which has been described with reference to FIGS. 5 to 7, a tremendous force resulting from the explosion of the semiconductor element 13 which occurs when an over curret flows therethrough is completely absorbed by the elastic composite explosion-proof member 20.

Figure 6:
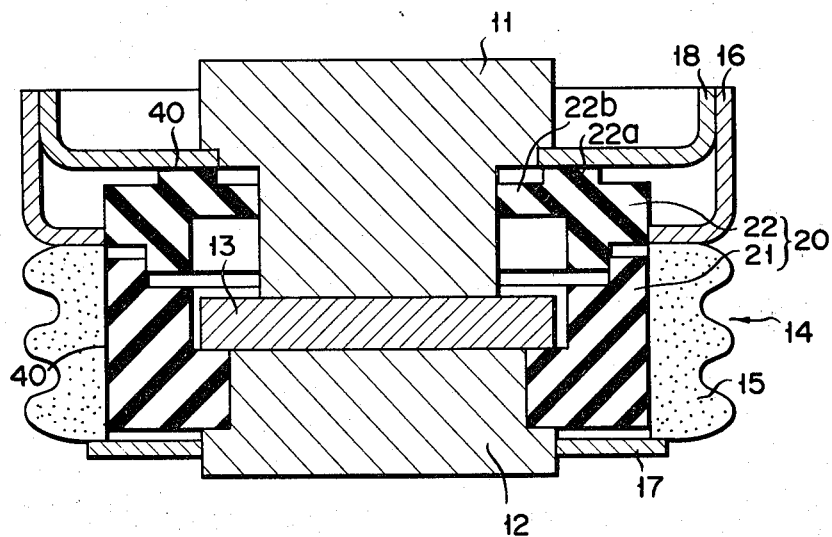
FIG. 6 is a cross-sectional view of the power semiconductor device according to the embodiment of FIG. 5, showing the displacement of the two slidable components of the explosion-proof member of FIG. 5 when the semiconductor element is exploded.

With the semiconductor device of FIGS. 5 to 7, the composite explosion-proof member 20 is formed of the two soft elastic components 21, 22 as previously described. Where, therefore, a semiconductor device is first assembled, the semiconductor element 13 can be easily set in a prescribed position between two components 21, 22, thereby ensuring a tighter contact between the semiconductor element 13 and composite explosion-proof member 20.

Figure 8:
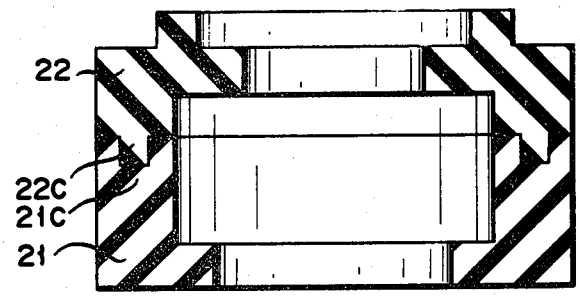
FIG. 8 is a cross-sectional view of the explosion-proof member used with the embodiment of FIG. 5, showing a different form of junction between the two slidable components of the explosion-proof member from that of FIG. 7.

FIG. 8 shows another modification of the composite explosion-proof member 20 of FIG. 5. With this modification, an annular projection 22c is formed on the underside of the upper explosion-proof component 22. An annular groove 21c is formed in the upper peripheral end of the lower explosion-proof component 21. This arrangement ensures a tighter contact between the two explosion-proof components 21, 22.

FIG. 9 illustrates still another modification of the composite explosion-proof member 20. Both explosion-proof components 21, 22 are provided with mutually facing inclined planes. This construction also improves the mutual tight attachment of the two explosion-proof components 21, 22.

Figure 10A:
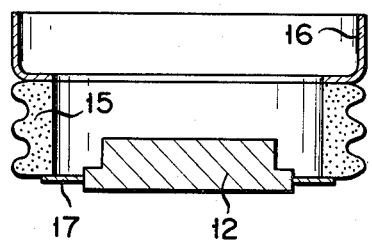
Figure 10C:
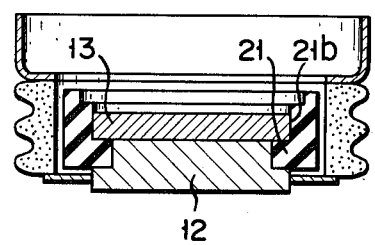
Figure 10B:
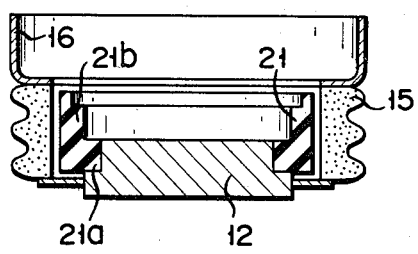
Figure 10D:
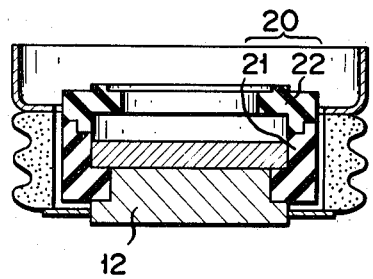
Figure 10E:
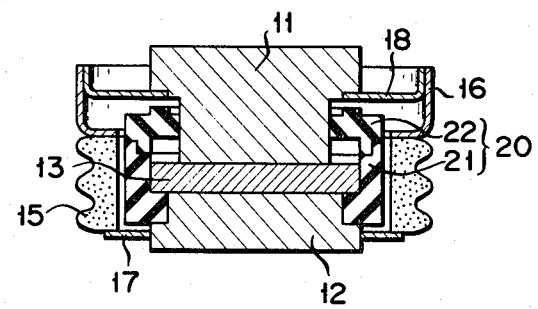

Description is now given with reference to FIGS. 10A to 10E of the steps of manufacturing the semiconductor device of FIG. 5. In the steps of FIG. 10A, annular members 16, 17 are respectively fitted to the upper and lower ends of a cylindrical member 15. A lower electrode 12 is fixed to the lower part of the lower annular member 17. In the step of FIG. 10B, a lower explosion-proof component 21 is inserted into the cylindrical member 15 from the side of the upper annular member 16 to let the inner peripheral surface 21a tightly touch the outer peripheral surface of the lower electrode 12. In the step of FIG. 10C, a semiconductor element 13 is inserted into the lower explosion-proof component 21, so that the peripheral surface of the semiconductor element 13 tightly contacts the inner peripheral surface 21b of the lower explosion-proof component 21 and also the upper surface of the lower electrode 12. The semiconductor element 13 is fixed in place in a state touching the upper surface of the lower electrode 12. In the step of FIG. 10D, the upper explosion-proof component 22 is mounted on the lower explosion-proof component 21. In the final step of FIG. 10E, an upper electrode 11 fitted with an inner annular member 18 is so set in the housing 14 as to press the semiconductor element 13 with a prescribed pressure. Thus, the inner annular member 18 and outer annular member 16 are securely set in place.

The explosion-proof member 20 of the foregoing embodiments was described simply for purpose of illustration. Obviously, the explosion-proof member 20 can be fabricated in various modifications. Further, a semiconductor device embodying this invention can be applied not only to a power rectifier but also to a power transistor, power thyristor and other similar equipment.

What we claim is:

1. A semiconductor device comprising:
   (a) a semiconductor element formed substantially in the shape of a disc;
   (b) first and second electrodes for sandwiching therebetween said semiconductor element,
      said first electrode including a first cylindrical portion having a flat first surface contacting said semiconductor element and a second cylindrical portion, integrally formed with said first cylindrical portion and having a diameter larger than the diameter of said first cylindrical portion, said second cylindrical portion further having a flat second surface extending in a radial direction beyond the circumference of said first cylindrical portion,
      said second electrode also including a flat surface contacting said semiconductor element and a cylindrical portion;
   (c) a housing forming an airtight chamber with said first and second electrodes and enclosing said semiconductor element; and
   (d) an explosion-proof member for absorbing a force produced by an explosion of said semiconductor element, disposed within said housing and enclosing said semiconductor element, said explosion-proof member including
      a central annular portion having an inner diameter not smaller than the diameter of said semiconductor element,
      a first annular portion integral with one end of the central annular portion and having an inner surface contacting the first cylindrical portion of said first electrode and a flat surface parallel to the flat second surface of said first electrode, and further having at least a first annular projection integrally formed on the flat surface of the first annular portion and extending in the axial direction of the first annular portion at least partially above the flat surface of the first annular portion, said projection having a surface pointing towards the radially extending flat second surface of the second cylindrical portion of said first electrode, and
      a second annular portion integral with the other end of the central annular portion and having an inner surface contacting the cylindrical portion of said second electrode.

2. A semiconductor device according to claim 1, wherein said explosion-proof member is made of a soft elastic insulative material.

3. A semiconductor device according to claim 2, wherein said surface of said annular projection is at least partially in contact with said radially extending flat second surface of the second cylindrical portion of said first electrode.

4. A semiconductor device according to claim 3, wherein said housing includes a hollow cylindrical insulative member open at both ends thereof and a first annular member attached to one end of said hollow cylindrical insulative member and a second annular member attached to the other end of said hollow cylindrical insulative member, said first electrode and said second electrode contacting, respectively, the inner periphery of said first annular member and the inner periphery of said second annular member.

5. A semiconductor device according to claim 3, wherein said housing includes a hollow cylindrical insulative member open at both ends thereof, the outer periphery of at least one of said central and second annular portions of said explosion-proof member contacting the inner surface of said housing.

6. A semiconductor device according to claim 4, wherein said explosion-proof member includes a plurality of annular projections substantially concentrically arranged on the flat surface of said first annular portion for contacting said first annular member of said housing.

7. A semiconductor device according to claim 2, wherein said first electrode further includes at least a first annular projection on the flat second surface of said second cylindrical portion, said first annular projection of said first electrode extending in the axial direction of said second cylindrical portion;

said explosion-proof member having on the flat surface of said first annular portion at least a second annular projection substantially concentrically arranged relative to said first annular projection thereon; and said first and second annular projections of said first annular portion defining between them an annular groove for receiving said first annular projection of said first electrode.

8. A semiconductor device according to claim 2, wherein said central annular portion of said explosion-proof member is further divided into a two-piece member comprised of a first component integral with said first annular portion and a second component integral with said second annular portion, said first and second components each having a surface for mutually engaging the other component and being movable at least in the axial direction while maintaining at least partial mutual engagement, whereby, when said semiconductor element explodes, said first and second components in at least partial mutual engagement slide in opposite axial directions and said explosion-proof member expands in the radial direction in such a way that the outer periphery of at least one of said first and second components at least partially contacts the inner surface of said housing.

9. A semiconductor device according to claim 8, wherein said housing includes an annular member attached to said first electrode; and wherein said first component of said explosion-proof member has at least one annular projection extending in the axial direction of said explosion-proof member and at least partially contacting said annular member at least upon explosion of said semiconductor element.

10. A semiconductor device comprising:
(a) a semiconductor element formed substantially in the shape of a disc;
(b) first and second electrodes substantially cylindrical in shape, each cylindrical electrode having opposing end surfaces for sandwiching said semiconductor element;
(c) a housing forming an airtight chamber with said first and second electrodes and enclosing said semiconductor element; and
(d) an explosion-proof member disposed in said housing for enclosing said semiconductor element and for absorbing a force produced by an explosion of said semiconductor element, said explosion-proof member further including at least a first component and a second component, said first component comprising a first hollow cylinder having an inner diameter not smaller than the diameter of said semiconductor element, said first hollow cylinder having first and second ends extending in the axial direction of said semiconductor element, said first hollow cylinder having a first ring integrally formed with said first end, said first ring extending in the radial direction of said semiconductor element and having an inner peripheral surface contacting the cylindrical surface of said first electrode, said second component comprising a second hollow cylinder having an inner diameter not smaller than the diameter of said semiconductor element, said second hollow cylinder extending in the axial direction of said semiconductor element and having first and second ends and a second ring integrally formed with said second end of said second hollow cylinder, said second ring extending in the radial direction of said semiconductor element and having an inner peripheral surface contacting the cylindrical surface of said second electrode, and said first and second components being mutually engaged for sliding in the axial direction of said semiconductor element and for maintaining sealing engagement upon explosion of said semiconductor element.

11. A semiconductor device according to claim 10, wherein the second end of said first hollow cylinder of said first component has a projection extending in the axial direction of said semiconductor element and the first end of said second hollow cylinder of said second component has a recess in which said projection is received.

12. A semiconductor device according to claim 10, wherein the second end of said first hollow cylinder of said first component has a slant face and the first end of said second hollow cylinder of said second component has a slant face biased for permitting full contact with the slant face of said first hollow cylinder.

* * * * *